(12) United States Patent
Chueh

(10) Patent No.: US 7,288,497 B1
(45) Date of Patent: Oct. 30, 2007

(54) CERAMIC POWDER

(76) Inventor: San-Tsai Chueh, 12F., No. 27, Jhongshan Rd., Lujhu Township, Taoyuan County 338 (TW)

( * ) Notice: Subject to any disclaimer, the term of this patent is extended or adjusted under 35 U.S.C. 154(b) by 0 days.

(21) Appl. No.: 11/477,356

(22) Filed: Jun. 30, 2006

(51) Int. Cl.
*C04B 35/14* (2006.01)
*C04B 35/04* (2006.01)

(52) U.S. Cl. ............ 501/112; 252/62; 252/62.55; 252/62.58; 252/587; 501/133

(58) Field of Classification Search ......... 252/62, 252/587, 62.58, 62.55; 501/112, 133
See application file for complete search history.

(56) References Cited

U.S. PATENT DOCUMENTS

| | | | | |
|---|---|---|---|---|
| 4,952,463 | A | * | 8/1990 | Atsushi ............ 428/552 |
| 5,145,540 | A | * | 9/1992 | Foley et al. ......... 156/89.17 |
| 5,271,965 | A | * | 12/1993 | Browning ............ 427/446 |
| 6,824,713 | B2 | * | 11/2004 | Kuzuoka et al. ....... 264/13 |

FOREIGN PATENT DOCUMENTS

| | | | |
|---|---|---|---|
| JP | 62-16407 A | * | 1/1984 |
| JP | 1-215756 A | * | 8/1989 |
| JP | 3-180295 A | * | 8/1991 |
| JP | 5-195427 A | * | 8/1993 |
| JP | 2001-161834 A | * | 6/2001 |

OTHER PUBLICATIONS

Derwent-Acc-No. 1981-50930D, abstract of Japanese Patent Specification No. 81-026081B (Jun. 1981).*

* cited by examiner

*Primary Examiner*—Anthony J. Green
(74) *Attorney, Agent, or Firm*—Rosenberg, Klein & Lee

(57) ABSTRACT

A ceramic powder including silicon dioxide, iron oxide, iron, magnesium oxide, aluminum oxide, and a trace element group. The silicon dioxide occupies the powder of total weight from 81% to 86%; the iron oxide occupies the powder of total weight from 12% to 16%; the iron occupies the powder of total weight from 0.5% to 2%; the magnesium oxide occupies the powder of total weight from 0.2% to 0.5%; the aluminum oxide occupies the powder of total weight from 0.05% to 0.3%; and the trace element group occupies the powder of total weight of remains. The powder converts heat energy to electromagnetic radiation not being absorbed by a metallic material but disappearing in the form of light quantum, and provides for heat dissipation from electronic components. The powder converts electromagnetic radiation to far infrared electromagnetic radiation, providing for electromagnetic radiation absorption from the electronic component.

4 Claims, 1 Drawing Sheet

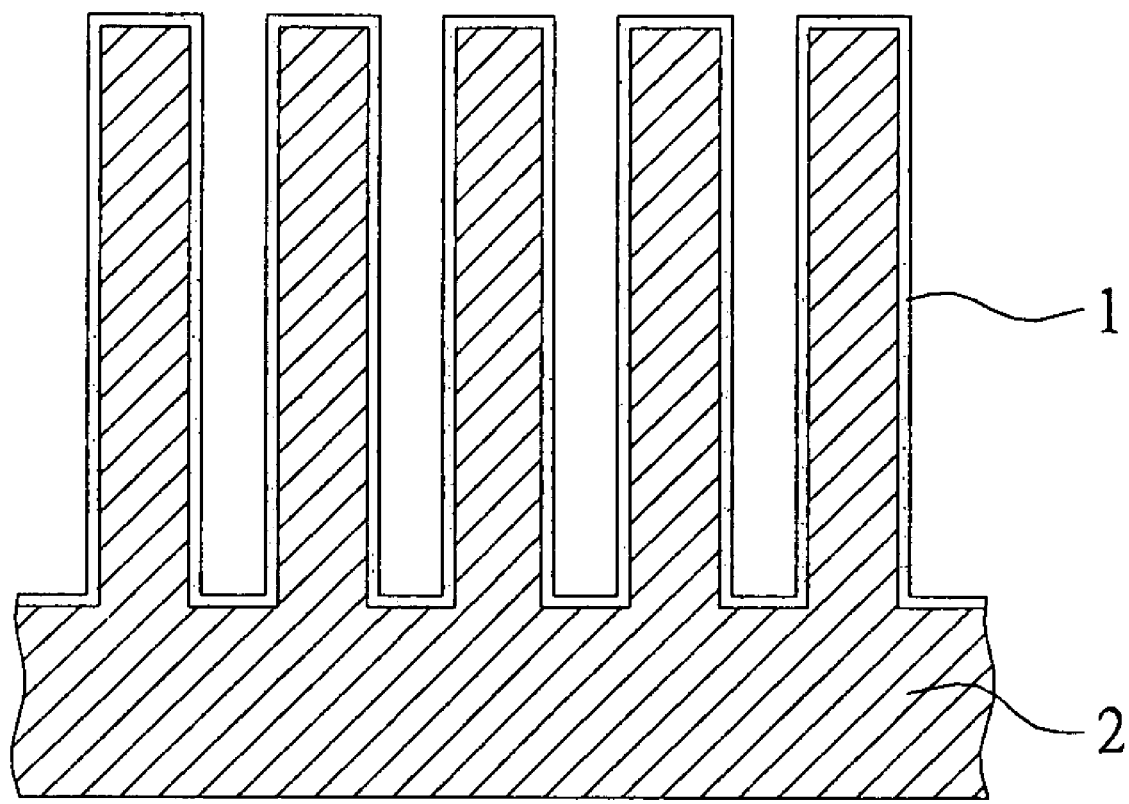

CERAMIC POWDER

BACKGROUND OF THE INVENTION

1. Field of the Invention

The present invention relates to ceramic powder and particularly to ceramic powder provided with the virtues of heat dissipation and electromagnetic radiation absorption.

2. Description of Related Art

There are many electronic components in an electrical unit or an electronic unit. When the electrical unit or the electronic unit works, the electronic components generate heat energy and electromagnetic radiation.

The heat energy generated by the electronic components makes the temperature of component go up and affects their performance. Eventually, the operation efficiency of electronic components decreases and is lost. For example, heat energy generated by a CPU in a computer makes the temperature of CPU go up. In that event, the operation efficiency of CPU decreases such that the computer performs slowly and may even crash. Thus, the heat energy generated by the electronic components must be further dissipated, without affecting their performance.

In a mode of heat dissipation for conventional electronic components, a heat-sink fin set and a fan are applied. The heat energy generated by the electronic components is transmitted to the heat-sink fin set, making the temperature of electronic components decrease. When the fan works, airflow is generated and passes through the heat-sink fin set to dissipate the heat energy. However, the fan needs electric power to work, which wastes energy.

Further, the electromagnetic radiation generated by the electronic components interferes with other electronic components distributed nearby and may affect the health of human beings in close proximity to electrical unit or the electronic unit. Consequently, the electromagnetic radiation generated by the electronic components must be further processed, while avoiding interference to other electronic components and respectively affecting the health of human beings.

The conventional method of processing electromagnetic radiation by the electronic components is by applying a metallic component. The metallic component is wrapped about the electronic component to shield the electronic component from the electromagnetic radiation. The electromagnetic radiation is not further used so that it is wasted.

Indeed, from the description mentioned formerly, a further improvement is required for the conventional method of dissipating the heat formed by the electronic components. The conventional method of processing electromagnetic radiation by electronic components is obviously inconvenient and imperfect in practical use.

For this reason, in consideration of improving upon the defects described above, the inventor, having concentrated their studies and operating in coordination with academic theories, has finally provided this invention as a reasonable design and an effective improvement over the defects mentioned above.

SUMMARY OF THE INVENTION

This invention is directed to a ceramic powder, which gives an electronic component the virtues of heat dissipation and absorption of electromagnetic radiation.

In order to achieve the objective mentioned above, this invention provides the ceramic powder comprising silicon dioxide, iron oxide, iron, magnesium oxide, aluminum oxide, and a group of trace elements, in which the silicon dioxide occupies the ceramic powder of total weight ranging from 81% to 86%, the iron oxide occupies the ceramic powder of total weight ranging from 12% to 16%, the iron occupies the ceramic powder of total weight ranging from 0.5% to 2%, the magnesium oxide occupies the ceramic powder of total weight ranging from 0.2% to 0.5%, the aluminum oxide occupies the ceramic powder of total weight ranging from 0.05% to 0.3%, and the group of trace elements occupies the ceramic powder of total weight of remains.

In a preferred embodiment, the specific weight of the ceramic powder is 2.5 g/cm3.

In the preferred embodiment, the emissivity of far infrared electromagnetic radiation generated by the ceramic powder is 0.93.

With the component parts, the ceramic powder may convert heat energy to the electromagnetic radiation that is not absorbed by a metallic material but disappears in the form of light. Thus, the ceramic powder provides for heat dissipation from the electronic component.

With the component parts, the ceramic powder may convert harmful electromagnetic radiation to far infrared electromagnetic radiation. Thus, the ceramic powder provides for absorption of the electromagnetic radiation from the electronic component.

BRIEF DESCRIPTION OF THE DRAWINGS

The FIGURE is a partial sectional view illustrating ceramic powder applied to a heat-sink fin set according to this invention.

DETAILED DESCRIPTION OF THE PREFERRED EMBODIMENTS

In order to further understand the technical means and effects adopted to achieve the objectives of this invention, please refer to the detailed description and accompanied drawings according to this invention. It is believed that the objectives, features, and points of this invention will be apparent from the description; however, the accompanied drawings are provided for reference and illustration only and not intended to limit the terms or scope of this invention.

Please refer to the FIGURE as a partial sectional view illustrating ceramic powder applied to a heat-sink fin set according to this invention. This invention is a ceramic powder 1, including silicon dioxide ($SiO_2$), iron oxide ($Fe_3O_4$), iron (Fe), magnesium oxide (MgO), aluminum oxide ($Al_2O_3$), and a group of trace elements.

The silicon dioxide occupies the ceramic powder 1 of total weight ranging from 81% to 86%.

The iron oxide occupies the ceramic powder 1 of total weight ranging from 12% to 16%.

The iron occupies the ceramic powder 1 of total weight ranging from 0.5% to 2%.

The magnesium oxide occupies the ceramic powder 1 of total weight ranging from 0.2% to 0.5%.

The aluminum oxide occupies the ceramic powder 1 of total weight ranging from 0.05% to 0.3%.

The group of trace elements occupies the ceramic powder 1 of total weight of remains. The group of trace elements includes copper (Cu).

The ceramic powder 1 according to this invention may be a high-energy material of powder that is made of ceramic. The specific weight of ceramic powder is 2.5 g/cm$^3$. The emissivity of far infrared electromagnetic radiation generated by the ceramic powder 1 is 0.93.

On a qualitative analysis, the ceramic powder 1 is an energy conversion carrier. The ceramic powder 1 has excellent characteristic including absorption of heat, light, electricity, and magnetism. The ceramic powder 1 absorbs the energy of heat, light, electricity, and magnetism so that an energy required for an electron transition of the ceramic powder 1 is formed and then converted to electromagnetic radiation ranging from 2 microwave meters to 18 microwave meters and emitted out.

The electromagnetic radiation ranging from 2 microwave meters to 18 microwave meters affects objects having diatomic and polyatomic molecule with hydrogen bonds to arouse the molecules thereof thereby creating a heating effect.

The electromagnetic radiation ranging from 2 microwave meters to 18 microwave meters is not a heating medium but a heating effect that may be absorbed by the object. In other words, generation of the heat energy from the object depends on absorption of the electromagnetic radiation ranging from 2 microwave meters to 18 microwave meters into the object.

With the component parts, the ceramic powder 1 may convert heat energy to electromagnetic radiation ranging from 2 microwave meters to 18 microwave meters which is not absorbed by a metallic material but disappears in the form of light quantum. Thus, the ceramic powder 1 may provide a virtue of heat dissipation for the electronic component.

With the component parts, the ceramic powder 1 converts electromagnetic radiation to far infrared electromagnetic radiation ranging from 2 microwave meters to 18 microwave meters that is not harmful to human beings. Thus, the ceramic powder 1 provides for absorption of the electromagnetic radiation from the electronic component.

As shown in FIG. 1, the ceramic powder 1 is arranged on the surface of the heat-sink fin set 2. The heat-sink fin set 2 is installed on an electronic component (not shown). For example, the heat-sink fin set 2 is installed on a CPU in a computer. The heat energy generated by the CPU is transmitted to the heat-sink fin set 2 and directly absorbed by the ceramic powder 1 so as to be converted to electromagnetic radiation ranging from 2 microwave meters to 18 microwave meters which is not absorbed by the metallic material but disappears in the form of light quantum. Consequently, the temperature of CPU decreases so as to surely operate normally, and electric power required by a fan that generates airflow also is saved when operating.

Besides, the ceramic powder 1 absorbs the energy of heat, light, electricity, and magnetism around and convert such into electromagnetic radiation ranging from 2 microwave meters to 18 microwave meters to be emitted out. The electromagnetic radiation ranging from 2 microwave meters to 18 microwave meters is far infrared electromagnetic radiation. Thus, the electromagnetic radiation generated by the electronic components does not interfere with other electronic components distributed nearby and does not affect the health of human beings in close proximity to the electrical unit or the electronic unit.

For this reason, provided with the virtues of heat dissipation and electromagnetic radiation absorption, the ceramic powder 1 serves as a low cost protective material with excellent characteristics effects.

For this reason, through the ceramic powder of this invention, the following characteristics are provided:

1. With the component parts, the ceramic powder converts heat energy to electromagnetic radiation that is not absorbed by a metallic material but disappears in the form of light quantum. Thus, the ceramic powder provides heat dissipation from the electronic component.

2. With the component parts, the ceramic powder converts electromagnetic radiation to far infrared electromagnetic radiation. Thus, the ceramic powder provides for absorption of the electromagnetic radiation from the electronic component.

However, the detailed description and drawings of the embodiments according to this invention are provided without the intention of limiting its scope or characteristics. Those of ordinary skill in the art should include any equivalent changes and modifications as falling within the true scope and spirit of the present invention.

What is claimed is:

1. A ceramic powder comprising:
a silicon dioxide in the amount of 81% to 86% by weight;
an iron oxide in the amount of 12% to 16% by weight;
iron in the amount of 0.5% to 2% by weight;
a magnesium oxide in the amount of 0.2% to 0.5% by weight; and
an aluminum oxide in the amount of 0.05% to 0.3% by weight.

2. The ceramic powder according to claim 1, wherein a specific weight of the ceramic powder is 2.5 g/cm$^3$.

3. The ceramic powder according to claim 1, wherein an emissivity of far infrared electromagnetic radiation generated by the ceramic powder is 0.93.

4. The ceramic powder according to claim 1, further comprising copper as a trace element.

* * * * *